(12) United States Patent
Shih et al.

(10) Patent No.: US 7,917,563 B1
(45) Date of Patent: Mar. 29, 2011

(54) READ CHANNEL PROCESSOR

(75) Inventors: Shih-Ming Shih, San Jose, CA (US);
Hemant Thapar, San Jose, CA (US);
Marcus Marrow, Santa Clara, CA (US)

(73) Assignee: Link_A_Media Devices Corporation, Santa Clara, CA (US)

( * ) Notice: Subject to any disclaimer, the term of this patent is extended or adjusted under 35 U.S.C. 154(b) by 1370 days.

(21) Appl. No.: 11/350,388

(22) Filed: Feb. 7, 2006

(51) Int. Cl.
*G06F 17/10* (2006.01)
(52) U.S. Cl. ....................................... 708/322
(58) Field of Classification Search ................... 708/322
See application file for complete search history.

(56) References Cited

U.S. PATENT DOCUMENTS

| | | | |
|---|---|---|---|
| 4,903,247 A * | 2/1990 | Van Gerwen et al. ........ 708/321 |
| 5,058,047 A * | 10/1991 | Chung ........................... 708/322 |
| 5,321,559 A * | 6/1994 | Nguyen et al. ................. 360/46 |
| 5,606,464 A | 2/1997 | Agazzi et al. |
| 5,793,801 A | 8/1998 | Fertner |
| 5,825,318 A | 10/1998 | Patapoutian et al. |
| 6,185,175 B1 | 2/2001 | Zook |
| 6,236,343 B1 | 5/2001 | Patapoutian |
| 6,249,398 B1 | 6/2001 | Fisher et al. |
| 6,252,733 B1 | 6/2001 | Staszewski |
| 6,335,949 B1 | 1/2002 | Kim |
| 6,728,894 B2 | 4/2004 | McEwen et al. |
| 6,810,485 B2 | 10/2004 | McEwen et al. |
| 6,920,280 B2 | 7/2005 | Okamoto |
| 7,012,772 B1 | 3/2006 | Vis |
| 7,031,405 B1 | 4/2006 | Touzni et al. |
| 7,424,074 B2 | 9/2008 | Lee et al. |
| 2002/0150179 A1 | 10/2002 | Leis et al. |
| 2003/0030930 A1 | 2/2003 | Sugawara et al. |
| 2004/0071232 A1 | 4/2004 | Del Souza et al. |
| 2004/0071234 A1 | 4/2004 | Li |
| 2004/0076245 A1 | 4/2004 | Okamoto et al. |
| 2005/0078772 A1 | 4/2005 | Cideciyan et al. |
| 2006/0067434 A1 | 3/2006 | Kovintavewat et al. |
| 2006/0092804 A1 | 5/2006 | Otake et al. |
| 2006/0181797 A1 | 8/2006 | Sugawara et al. |
| 2008/0151988 A1 | 6/2008 | Agazzi et al. |
| 2008/0260014 A1 | 10/2008 | Yang et al. |
| 2009/0136219 A1 | 5/2009 | Kikugawa et al. |

OTHER PUBLICATIONS

Moon et al. "Equalization for Maximum Likelihood Detectors." IEEE Transactions on Magnetics, vol. 31, No. 2. Mar. 1995. pp. 1083-1088.
Kovintavewat et al. "Generalized Partial Response Targets for Perpendicular Recording." Georgia Institute of Technology, Atlanta, GA and Seagate Technology, Pittsburgh, PA.

\* cited by examiner

*Primary Examiner* — Tan V Mai
(74) *Attorney, Agent, or Firm* — Van Pelt, Yi & James LLP

(57) ABSTRACT

Adapting a read channel processor is disclosed. Adapting includes determining a target output for input data from a variable target function, determining a filter output corresponding to the input data from a programmable filter having programmable filter coefficients, comparing the target output and the filter output, and recursively updating both the variable target function and the programmable filter coefficients to improve the comparison between the target output and the filter output.

23 Claims, 13 Drawing Sheets

DFE and Viterbi detector error rates sensitivity to incorrect sampling phase

Mode 1 S-Curve

Mode 2 S-Curve

Mode 3 S-Curve

Mode 2 S-Curve; (a) Correct Gain,
(b) Gain +10% and (c) Gain -10%

READ CHANNEL PROCESSOR

BACKGROUND OF THE INVENTION

Adaptive equalization is used in a variety of applications, including in storage devices, such as magnetic or optical disk drives. The calibration of a typical equalization system can require a significant amount of resources during manufacture and test. For example, selecting an optimal target filter may involve batch processing of numerous potential target filter coefficients during manufacture. In addition, having an individual target for each disk is impractical. There is therefore a need for a more efficient method of target selection.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
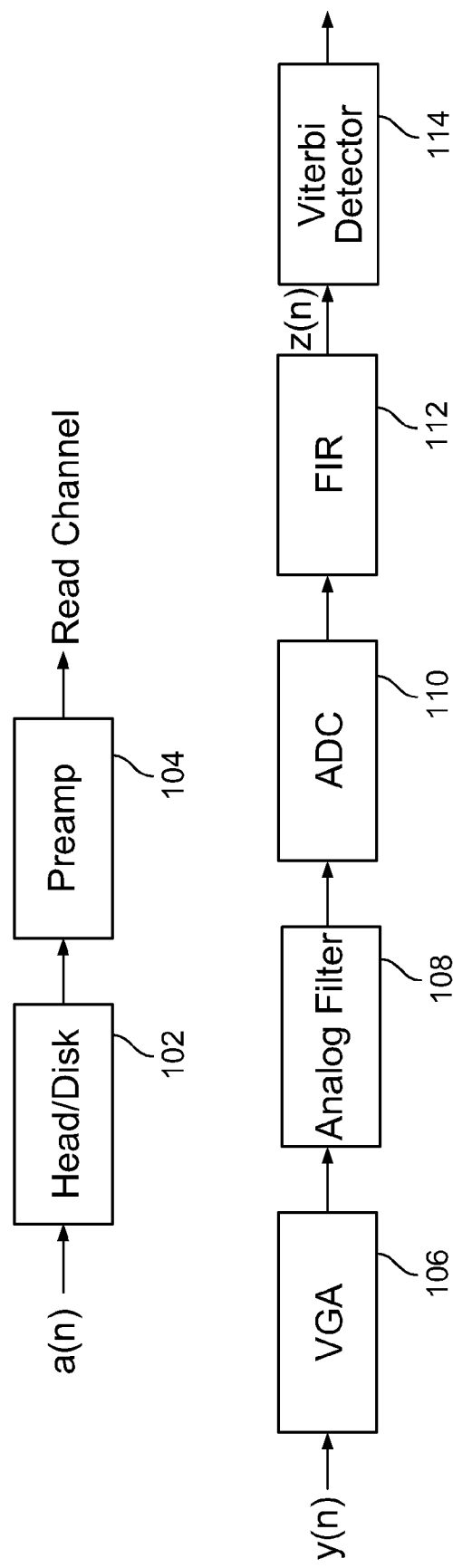
FIG. 1 is a block diagram illustrating an embodiment of a data storage system.

FIG. 1 is a block diagram illustrating an embodiment of a data storage system. In this example, data a(n) is provided to head or disk 102. The output of disk heads 102 is provided to preamplifier 104. The output of preamplifier 104 is provided to a read channel. Data y(n) is received from the read channel and provided to variable gain amplifier (VGA) 106. The output of VGA 106 is provided to analog filter 108. The output of analog filter 108 is provided to analog to digital converter (ADC) 110. The output of ADC 110 is provided to finite impulse response (FIR) filter 112. FIR filter 112 is used to perform equalization of y(n). Output z(n) of FIR filter 112 is provided to Viterbi Detector 114.

In the example shown, $$z(n)=c(n)*y(n)$$

As used herein, the symbol * refers to convolution. Thus, $$z(n) = \sum_{i=0}^{N-1} c_i y(n-i)$$

where N is the number of taps in FIR filter 112 and $\{c_i\}$ are the coefficients of FIR filter 112. $\{c_i\}$ may be chosen such that an error is minimized, as more fully described below.

Figure 2:
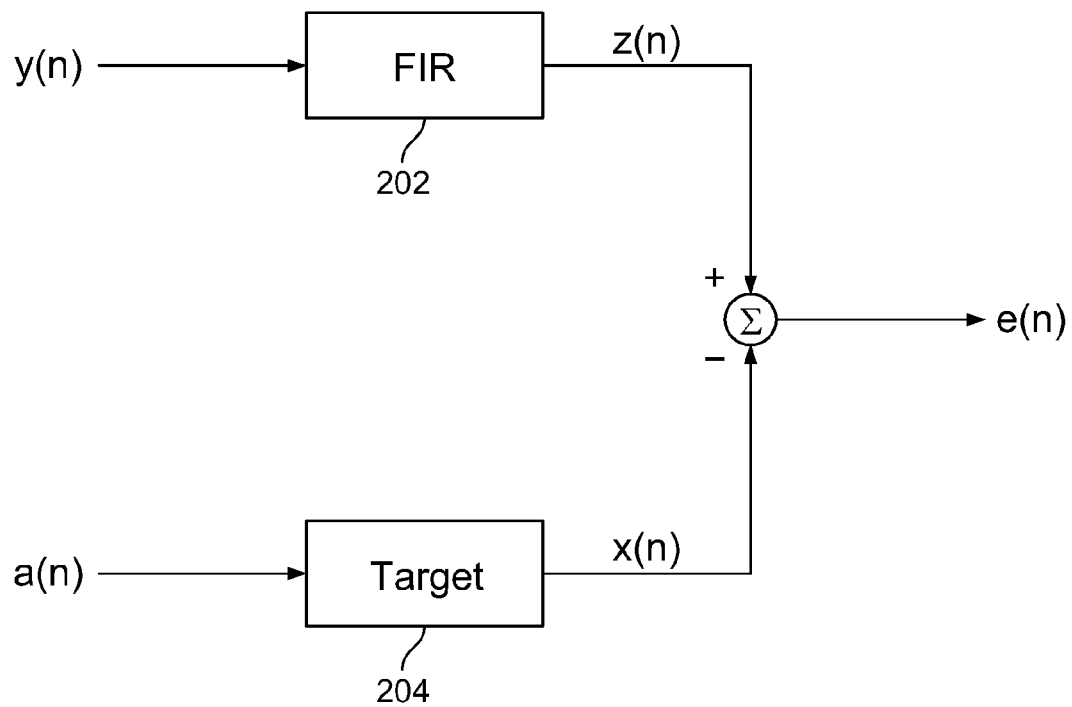
FIG. 2 is a block diagram illustrating an embodiment of a system for determining an error.

FIG. 2 is a block diagram illustrating an embodiment of a system for determining an error. In this example, received sequence y(n) is provided to FIR filter 202 to produce z(n). Known sequence a(n) is provided to target filter 204 to produce x(n). The output of target filter 204 x(n) is subtracted from the output of FIR filter 202 z(n) to produce error sequence e(n). In this example, $$e(n)=z(n)-x(n)$$

For example, target filter 204 may have coefficients $T_1, T_2, T_3$, and $T_4$ associated with filter $1+T_1D+T_2D^2T_3D^3+T_4D^4$. $T_1, T_2, T_3$, and $T_4$ are programmable and may be different for different physical media. $T_1, T_2, T_3$, and $T_4$ are selected to optimize performance for a given head. For example, $T_1, T_2, T_3$, and $T_4$ may be selected to optimize bit error rate (BER) performance for a given head. $T_1, T_2, T_3$, and $T_4$ may be selected to shape the output to have a particular spectrum. In various embodiments, target filter 204 can have any number of coefficients.

For a given target, target filter 204 is used to train the coefficients of FIR filter 202. This may be performed by inputting a known sequence a(n) and trying different coefficients of FIR filter 202 until e(n) is sufficiently small.

In some embodiments, the coefficients of the target filter are first determined. Then the coefficients of the FIR filter may be computed. In some embodiments, the coefficients of the FIR filter and target filter may be jointly computed on-chip. A recursive optimization method, such as Least Mean Squares (LMS), may be used to jointly compute the coefficients of the FIR filter and target filter on-chip. In this example, $$e(n)=z(n)-x(n)$$

where $$z(n) = y(n) * c(n) = \sum_{i=0}^{N-1} c_i y(n-i)$$

$$x(n) = a(n) * T(n) = \sum_{i=0}^{M-1} T_i a(n-i)$$

$\{c_i\}$ and $\{T_i\}$ may be chosen by minimizing $\Sigma e_n^2$, subject to one of the following constraints:

$$T_0 = 1 \quad (1)$$

or:

$$\Sigma T_i^2 = 1 \quad (2)$$

N is the number of taps in FIR filter 202 and $\{c_i\}$ are the coefficients of FIR filter 202. M is the number of taps in target filter 204 and $\{T_i\}$ are the coefficients of target filter 204. The error is e(n).

The following updates can be computed:

$$\Delta c_i = e(n) y(n-i) \quad \text{Equation 1A}$$

$$\Delta T_i = e(n) a(n-i) \quad \text{Equation 1B}$$

For each iteration, $\Delta c_i$ and $\Delta T_i$ are the amounts that $c_i$ and $T_i$ are updated, respectfully. Using the above updates with a recursive optimization method, such as LMS, a joint optimization of target and FIR coefficients for an individual head or disk can be achieved. The amount that $T_i$ changes during each iteration is proportional to the value of the error. The amount that $c_i$ changes during each iteration is proportional to the value of the error.

Figure 3:
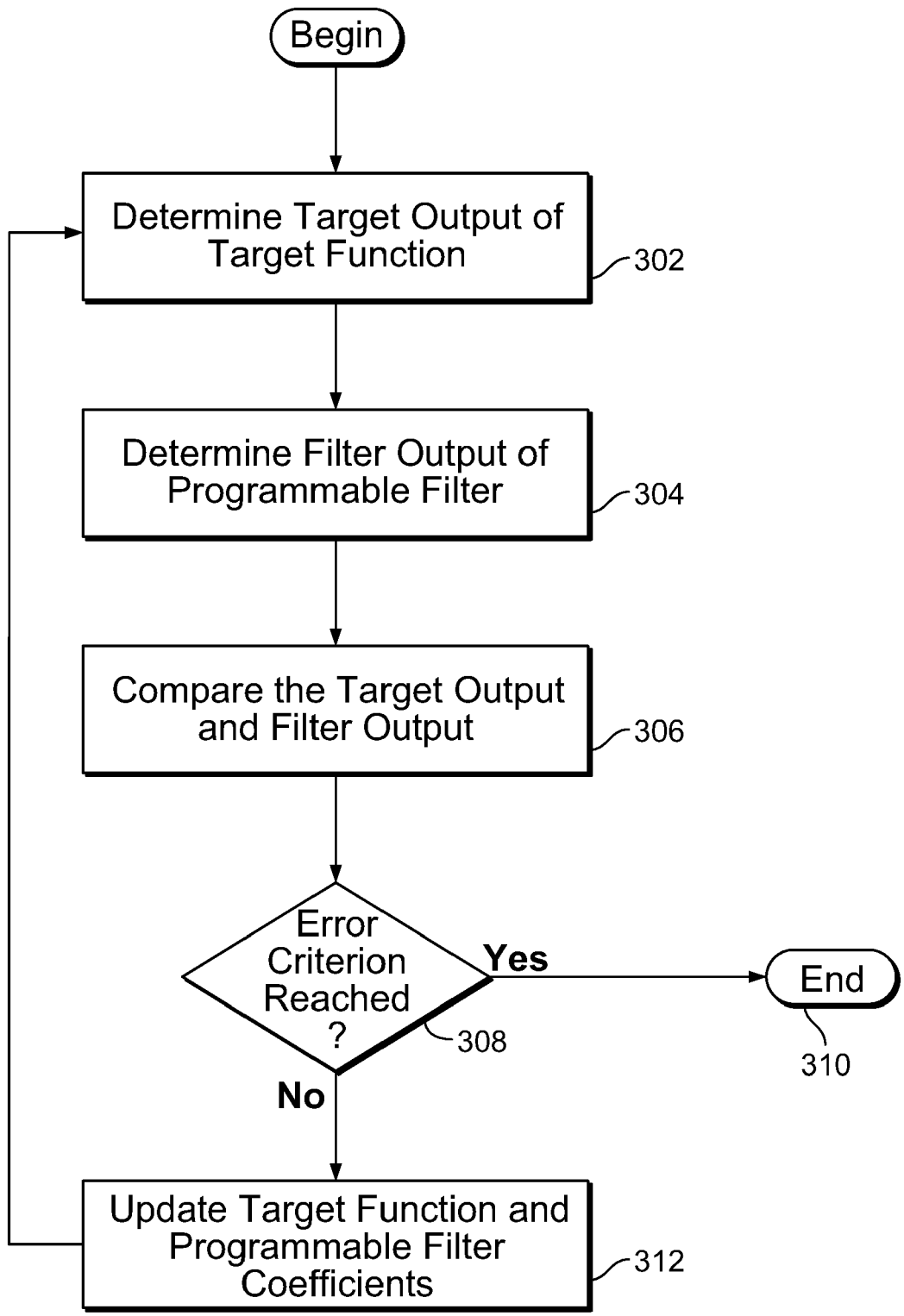
FIG. 3 is a flowchart illustrating an embodiment of a process for recursively determining filter coefficients.

FIG. 3 is a flowchart illustrating an embodiment of a process for recursively determining filter coefficients. In this example, at 302, a target output of a target function is determined. For example, output x(n) of target filter 204 is determined. At 304, a filter output of a programmable filter is determined. For example, filter output z(n) of programmable FIR filter 202 is determined. At 306, the target output and filter output are compared. For example, the difference between z(n) and x(n) is computed. At 308, it is determined whether an error criterion is satisfied. For example, when $\Sigma e_n^2$ is less than a predetermined value, the error criterion may be deemed satisfied. If the error criterion is satisfied, the process ends at 310. If the error criterion is not satisfied, then the target function coefficients and programmable filter coefficients are updated. For example, the programmable filter coefficient may be updated according to Equation 1A. The target function coefficients may be updated according to Equation 1B. The process returns to 302.

In some embodiments, this process is performed during manufacturing. In some embodiments, this process is performed online or post-manufacturing. For example, it may be determined that the performance of the storage device has deteriorated. An erasure or error condition could be detected and a recalibration performed. In some embodiments, a user interface could be used to request that a recalibration be performed.

Timing Loop

Figure 4:
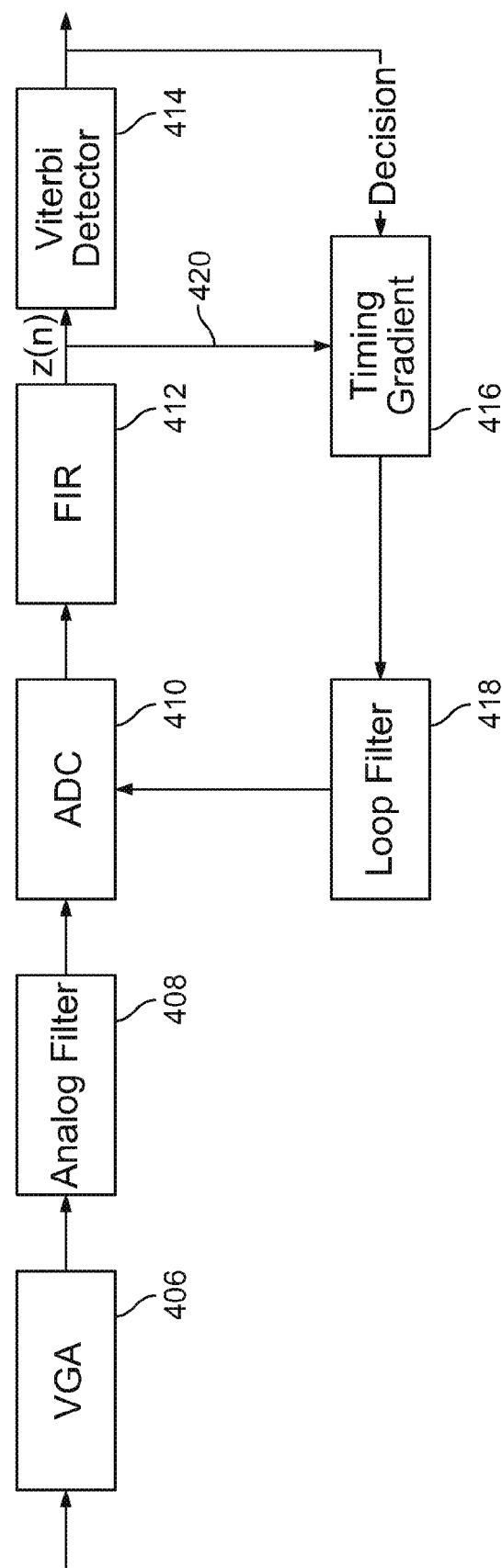
FIG. 4 is a block diagram illustrating an embodiment of a timing loop with a predetermined target filter.

FIG. 4 is a block diagram illustrating an embodiment of a timing loop with a predetermined target filter. In this example, data is received from a read channel and provided to variable gain amplifier (VGA) 406. The output of VGA 406 is provided to analog filter 408. The output of analog filter 408 is provided to analog to digital converter (ADC) 410. The output of ADC 410 is provided to finite impulse response (FIR) filter 412. FIR filter 412 is used to perform equalization. The output of FIR filter 412 is provided to Viterbi Detector 414.

As shown, the timing loop includes timing gradient 416 and loop filter 418. The output of Viterbi Detector 414 is provided to timing gradient 416. As used herein, a timing gradient may also be referred to as a timing error detector (TED). The output of FIR filter 412 is provided to timing gradient 416 via path 420. Timing gradient 416 estimates a sampling phase error. The output of timing gradient 416 is provided to loop filter 418. Loop filter 418 averages the values provided by timing gradient 416. The output of loop filter 418 is provided to ADC 410 to adjust the sampling phase of ADC 410.

In this example, a target filter is predetermined and FIR filter 412 is trained to match the target. FIR filter 412 is constrained to have a fixed time delay response. In other words, as the FIR varies, the phase response is constrained such that the time delay response is fixed (e.g., near 0 frequency). If FIR filter 412 does not have a fixed time delay response, it is capable of canceling out the effect of the timing loop.

Figure 5:
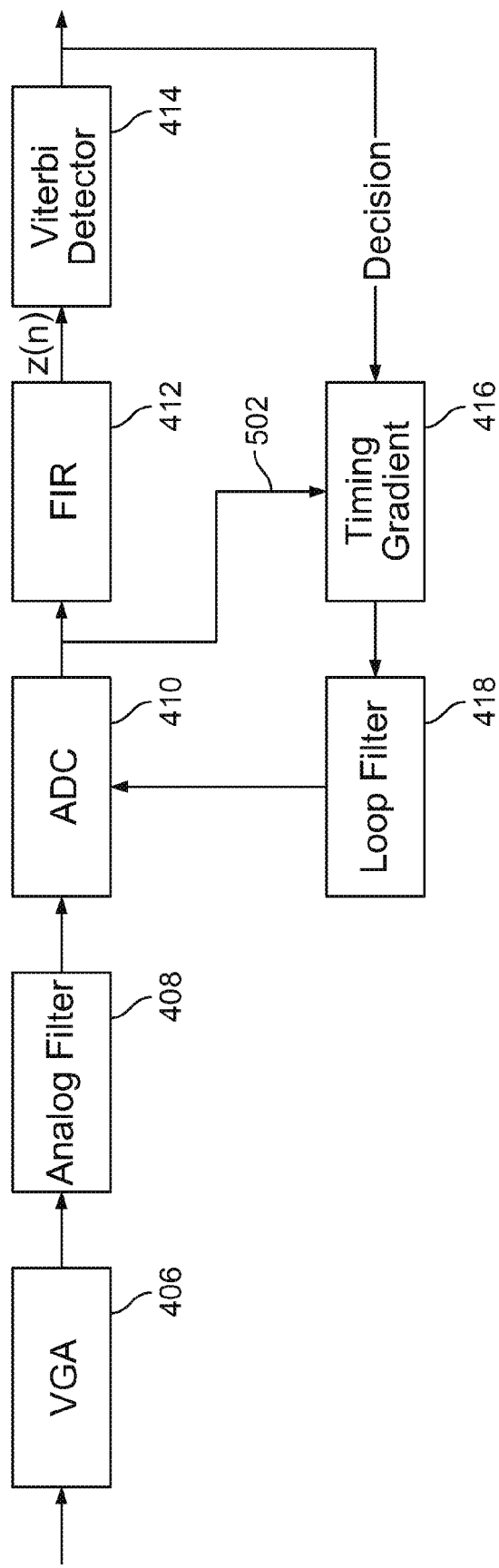
FIG. 5 is a block diagram illustrating an embodiment of a timing loop without a predetermined target filter.

FIG. 5 is a block diagram illustrating an embodiment of a timing loop without a predetermined target filter. In this example, data is received from a read channel and provided to variable gain amplifier (VGA) 406. The output of VGA 406 is provided to analog filter 408. The output of analog filter 408 is provided to analog to digital converter (ADC) 410. The output of ADC 410 is provided to finite impulse response (FIR) filter 412. FIR filter 412 is used to perform equalization. The output of FIR filter 412 is provided to Viterbi Detector 414.

As shown, the timing loop includes timing gradient 416 and loop filter 418. The output of Viterbi Detector 414 is provided to timing gradient 416. The output of ADC 410 is provided to timing gradient 416 via path 502. Timing gradient 416 estimates a sampling phase error. The output of timing gradient 416 is provided to loop filter 418. Loop filter 418 averages the values provided by timing gradient 416. The output of loop filter 418 is provided to ADC 410 to adjust the sampling phase of ADC 410.

In this example, the timing gradient is decoupled from FIR filter 412. Thus, as the target is optimized and FIR filter 412 is trained to match the target, the timing gradient is not affected. Phase error is not introduced to timing gradient 416 by FIR filter 412.

In some embodiments, a decision feedback equalizer (DFE) provides decisions to timing gradient 416.

Figure 6:
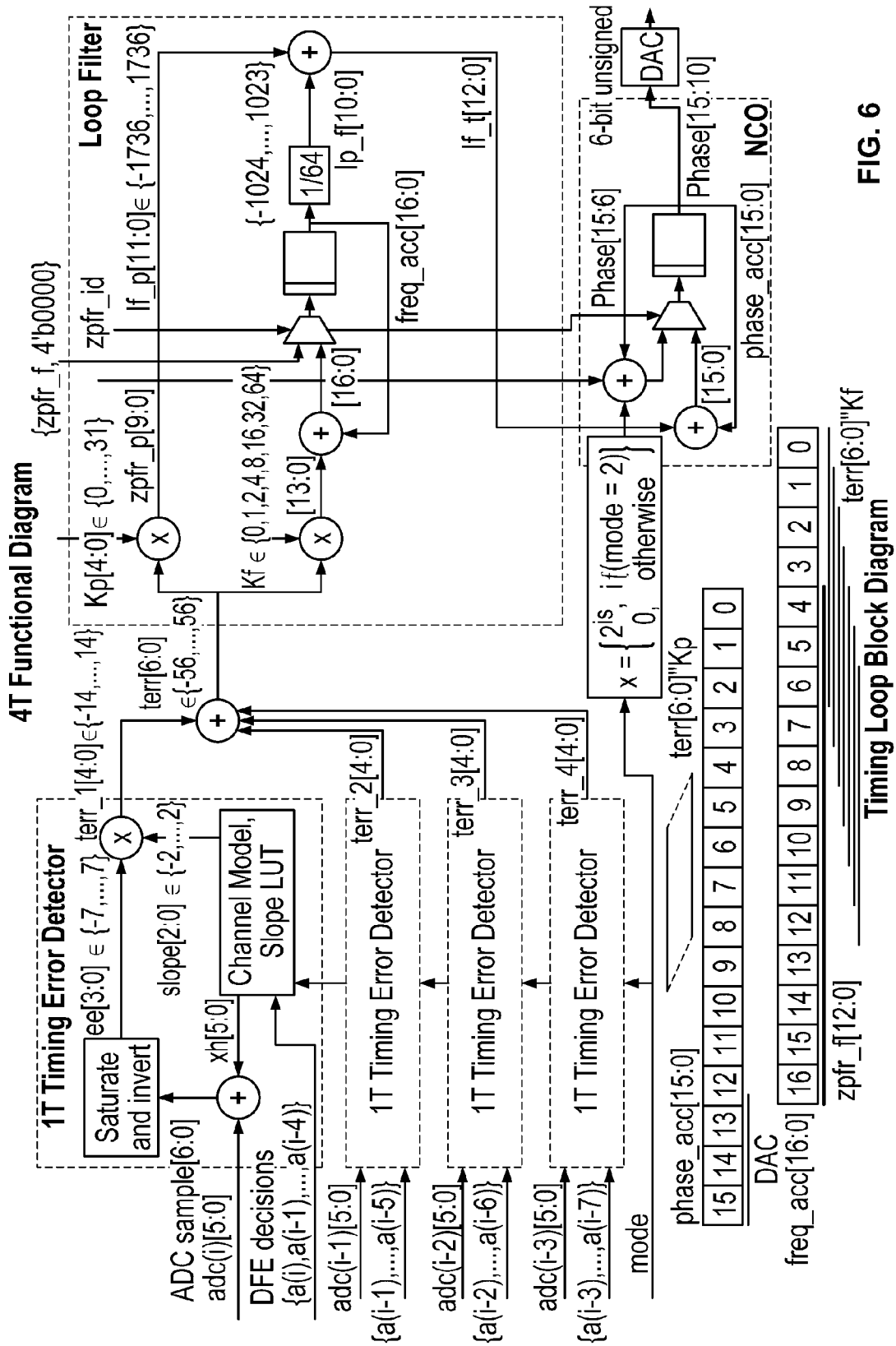
FIG. 6 is a diagram illustrating an example of a timing loop.

FIG. 6 is a diagram illustrating an example of a timing loop. In this example, the timing loop is a decision-directed loop which drives an ADC sampling clock to a known signal phase. In some embodiments, it is active only during tracking and is driven by the ADC output and tentative data decisions. During acquisition, a frequency accumulator in the loop filter is effectively set to zero and ADC samples the timing loop open-loop. At the end of acquisition, the zero phase and frequency restart (ZPFR) estimation block initializes the loop filter with the estimated phase and frequency errors.

The timing loop may be implemented in various ways. In this example, the timing loop operates on a 4T clock. A change of 1 DAC LSB causes a $(1/64)T_{VCO}$ change in sampling phase, where $T_{VCO}$ is a clock period. The timing DAC uses 6-bit unsigned signal representation.

Figure 9:
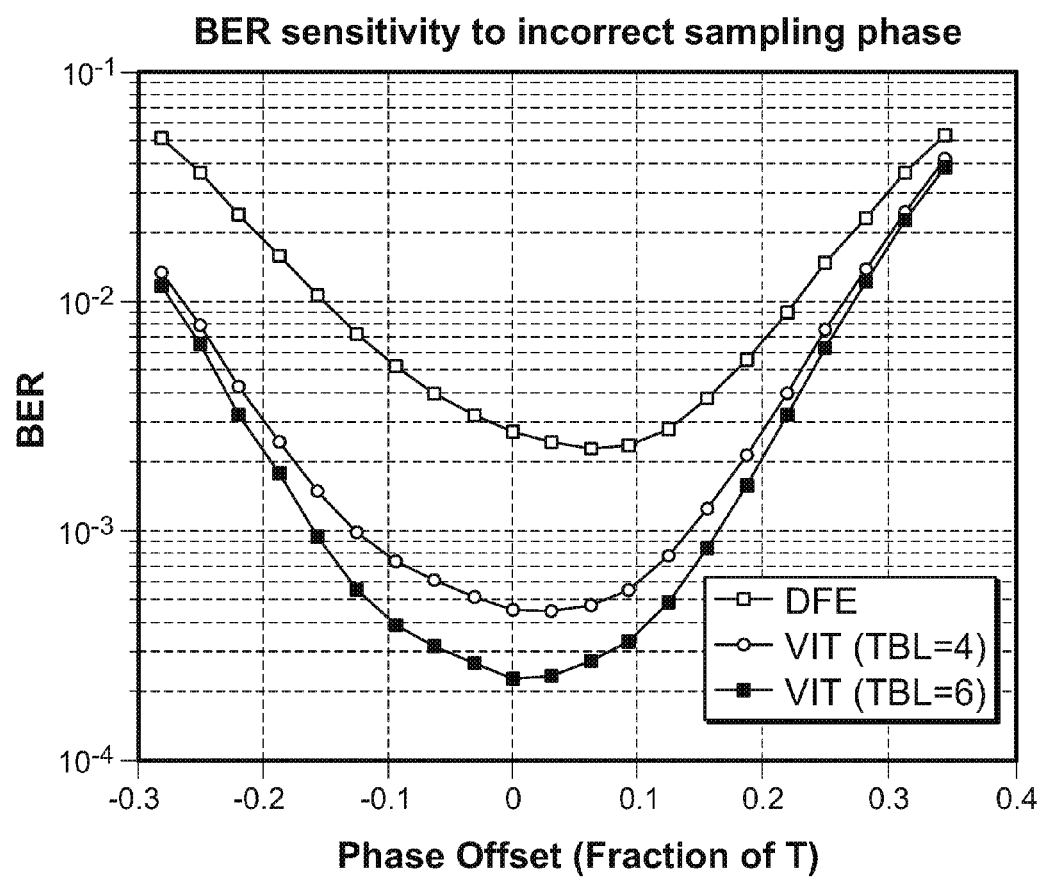
FIG. 9 is a plot illustrating an example of the DFE and Viterbi detector sensitivity to incorrect sampling phase.

The timing loop may be driven by either the DFE decisions or early Viterbi decisions. For example, the early Viterbi decisions may use a truncated path memory of length 6. FIG. 9 shows the sensitivity of the DFE and Viterbi detector to incorrect sampling phase, as more fully described below.

In some embodiments, the timing error detector has three modes of operation for a magnetic recording channel:

1. Longitudinal Recording—Peak sampling of preamble (LP)
2. Perpendicular Recording—Side sampling of preamble (PS)
3. Perpendicular Recording—Peak sampling of preamble (PP)

For example, a switch or other input to the device could be used to identify which mode of operation to use.

Figure 7:
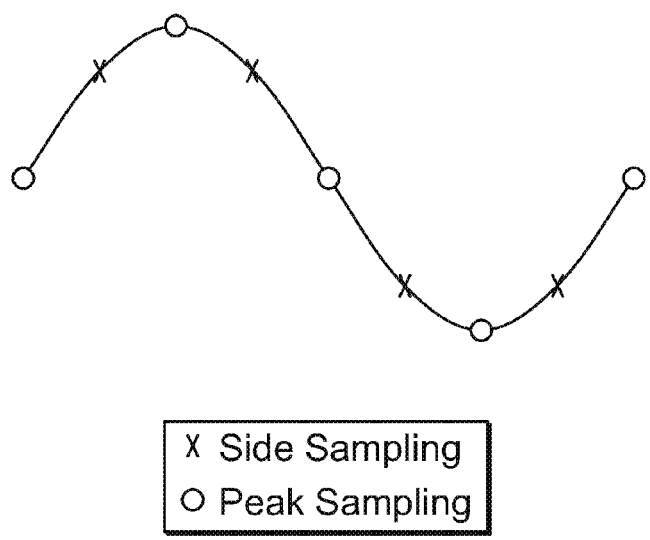
FIG. 7 is a diagram illustrating an example of sampling a recording signal.

FIG. 7 is a diagram illustrating an example of sampling a recording signal. A known preamble is used during phase acquisition. In this example, the preamble is a 4T sinewave. In other words, one period of the sinewave is four bit samples wide. Two types of sampling are shown. Peak sampling is indicated by the "O"s, and side sampling is indicated by the "X"s.

Different sampling phases may be used with different channels. To improve performance, a sampling phase appropriate for the channel may be chosen. For example, for perpendicular recording, side sampling of the preamble may be preferable to peak sampling.

In some embodiments, side sampling of a perpendicular recording signal yields improved results. The longitudinal channel includes a differentiator, such that the read head responds to changes in the signal. The differentiator introduces a 90 degree phase shift. Selecting a sampling phase determined such that the sampling would occur at the peak of a sine wave of period four times the bit period may be preferable for a longitudinal recording channel. This would mean that a sine wave at the Nyquist frequency (of period two times the bit period) would be sampled at its peaks.

In the case of a perpendicular recording channel, selecting a sampling phase determined such that the sampling would occur substantially at the side of a sine wave of period four times the bit period may be preferable. This would mean that a sine wave at the Nyquist frequency would be sampled substantially at its peaks.

Figure 8:
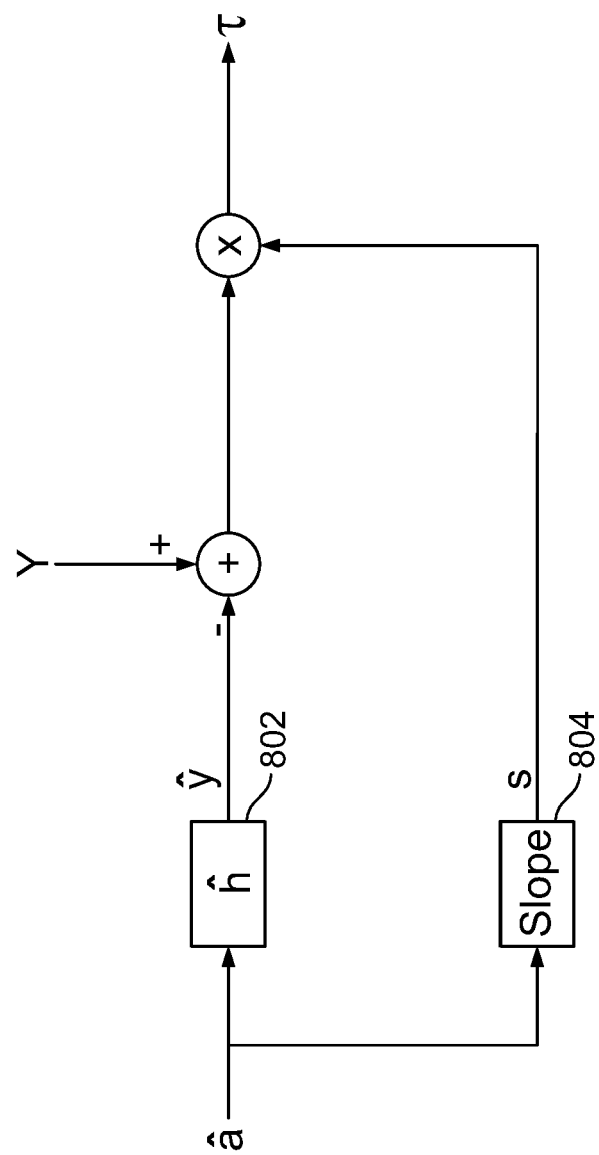
FIG. 8 is a block diagram illustrating an example of a timing gradient.

FIG. 8 is a block diagram illustrating an example of a timing gradient. For example, timing gradient 416 may be implemented in this way. In this example, â is provided as input to channel model 802. â is a decision from a DFE or Viterbi detector, such as Viterbi detector 414. Channel model 802 has a channel response ĥ. In some embodiments, channel model 802 is optional. ĥ is an estimate of the channel response of the system between the input and the output of the ADC, including the write head, read channel, and analog filter. The output of channel model 802 is ŷ. ŷ is an estimate of the ADC output when â is input to the channel. Channel model 802 may be implemented as a lookup table, as more fully described below.

Figure 10A:
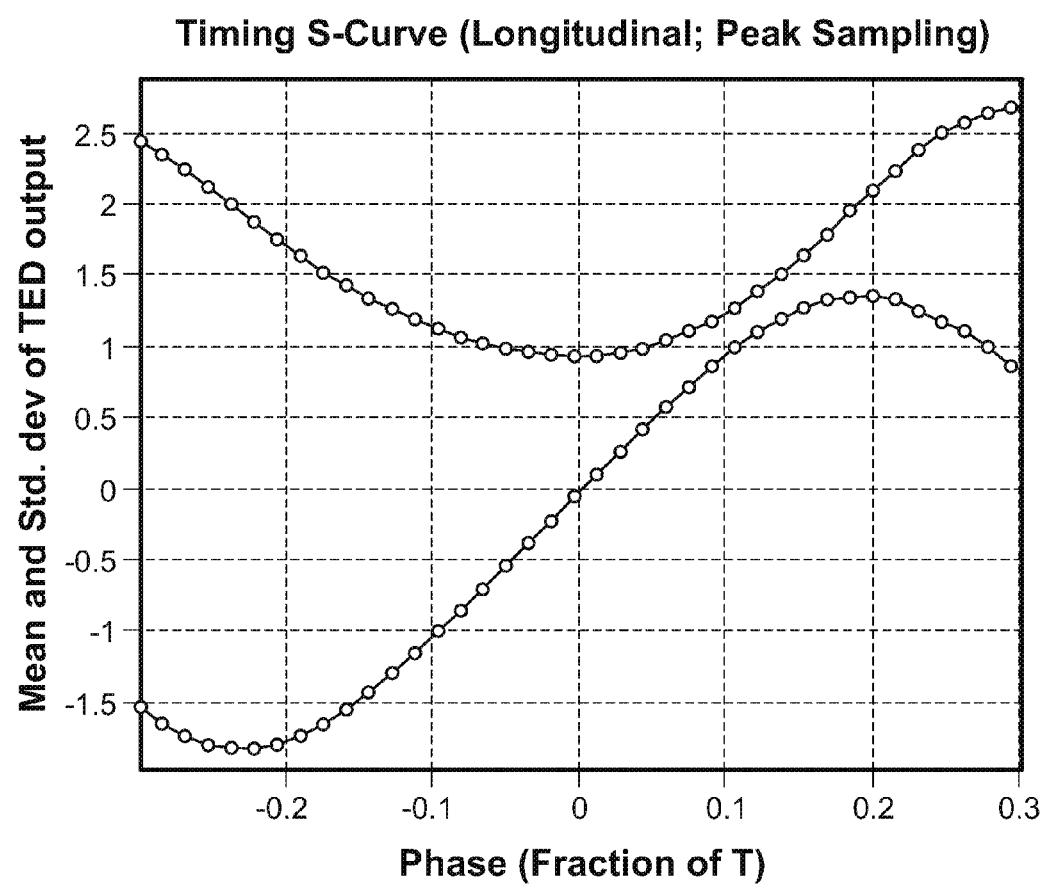
FIGS. 10A-10C are s-curves illustrating examples of the mean and variance of the timing error detector for each of the three modes of operation.

In some embodiments, analog filter 408 can be adjusted so that it equalizes to what the lookup table expects. This may improve performance of the system.

â is also provided as input to slope 804. Given an ADC output of â, slope 804 is the slope of a curve of ADC output versus phase, when the ADC output is â. For example, the slope of the lower curve in FIG. 10A is the inverse of slope 804. Slope 804 may be implemented as a lookup table, as more fully described below.

The difference between the actual ADC output y and ŷ is determined and multiplied by the output of slope 804 to produce the phase offset τ.

The timing gradient may be configured as shown in FIG. 4 or may be configured as shown in FIG. 5. In the case of FIG. 4, an estimated FIR output ẑ is determined instead of ŷ and the difference z−ẑ is determined instead of y−ŷ. Channel response ĥ accounts for FIR filter 412 and slope 804 is the slope of a curve of FIR output versus phase.

Slope 804 may be determined as follows.

Consider the signal $$y(t)=\hat{y}(t)+n(t),$$

where ŷ(t) is the noiseless received signal and n(t) is the noise. y(t) is sampled at fixed intervals of T (one bit period) and with phase φ:

$$y[i]=y(iT+\phi).$$

$$\hat{y}[i]=\hat{y}(iT+\phi).$$

$$n[i]=n(iT+\phi).$$

A sampling phase error τ introduces a signal error $$e(i;\tau)=y(iT+\phi+\tau)-\hat{y}[i],$$

which has energy (squared error) gradient $$\frac{\delta(e^2(i;\tau))}{\delta\tau} = 2e(\tau)\left[\frac{\delta y(t)}{\delta\tau}\right]_{t=iT+\phi+\tau}.$$

Given tentative decisions â[i], this gradient may be computed and used to drive the timing loop to a τ (in this case 0) that minimizes the mean squared error (MSE) $E_i[e^2(i;\tau)]$. The variance of the phase estimation error may be lowered using a zero-forcing gradient $$\frac{\delta(e^2(i;\tau))}{\delta\tau} \approx 2e(\tau)\left[\frac{\delta\hat{y}(t)}{\delta\tau}\right]_{t=iT+\phi}.$$

The slope $$\left[\frac{\delta\hat{y}(t)}{\delta\tau}\right]_{t=iT+\phi}$$

may be computed using the discrete derivative $$s[i] = \left[\frac{\delta\hat{y}(t)}{\delta\tau}\right]_{t=iT+\phi} \approx \hat{y}[i+1]-\hat{y}[i-1].$$

In some embodiments, the slope may be pre-computed as a function of â[i]. A slope look-up table (SLT) may be used in the timing loop.

In the following examples, the channel model uses a fixed degree 5 polynomial to approximate the combination of a hard drive channel and continuous time filter (CTF). The CTF was assumed to have a 12 dB boost and $F_c=0.25F_s$. The hard disk channel (HDC) is modeled as 1. Windowed Lorenzian with $PW_{50}/T=3$ for longitudinal recording mode.
2. Gaussian (pulse response) with $PW_{50}/T=2$ for perpendicular recording modes.

The gain of the channel model is such that the response to a 4T sinewave has amplitude 16. This results in the following channel responses:

$$\hat{y}=\hat{h}_{MODE}\otimes\hat{a}, \text{ where } \hat{a}\in\{-1,1\}^N$$

1. $\hat{h}_{LP}=[4, 4, -4, -4]$

2. $\underline{\hat{h}}_{PS}$=[−1.68, 2.57, 7.96, 2.57, −1.68]

3. $\underline{\hat{h}}_{PP}$=[−0.63, 7.37, 7.37, −0.63]

In this example, 4, 5, and 5 samples are used for the case of longitudinal peak ($\underline{\hat{h}}_{LP}$), perpendicular side ($\underline{\hat{h}}_{PS}$), and perpendicular peak ($\underline{\hat{h}}_{PP}$) sampling, respectively. In various embodiments, any number of samples may be used.

The timing gradient functions for each mode are

1. $s_{LP}$=0.5*[1, −1, −1, 1]

2. $s_{LP}$=0.5*[1, 2, 0−2, −1]

3. $s_{PP}$=0.5*[1, 1, −1, −1]

The hardware lookup tables are formed by rounding the channel outputs and slope to integers and saturating the slopes to −2/+2.

The longitudinal, peak sampling lookup tables are $$\begin{bmatrix} \hat{a}[i] & \hat{a}[i-1] & \hat{a}[i-2] & \hat{a}[i-3] & & \hat{y}[i] & s[i] \\ 0 & 0 & 0 & 0 & : & -13 & 0 \\ 0 & 0 & 0 & 1 & : & -15 & -1 \\ 0 & 0 & 1 & 0 & : & 1 & -1 \\ 0 & 0 & 1 & 1 & : & 0 & -2 \\ 0 & 1 & 0 & 0 & : & 1 & 1 \\ 0 & 1 & 0 & 1 & : & 0 & 0 \\ 0 & 1 & 1 & 0 & : & 16 & 0 \\ 0 & 1 & 1 & 1 & : & 15 & -1 \\ 1 & 0 & 0 & 0 & : & -15 & 1 \\ 1 & 0 & 0 & 1 & : & -16 & 0 \\ 1 & 0 & 1 & 0 & : & 0 & 0 \\ 1 & 0 & 1 & 1 & : & -1 & -1 \\ 1 & 1 & 0 & 0 & : & 0 & 2 \\ 1 & 1 & 0 & 1 & : & -1 & 1 \\ 1 & 1 & 1 & 0 & : & 15 & 1 \\ 1 & 1 & 1 & 1 & : & 13 & 0 \end{bmatrix}$$

For example, if the last four decisions â(i), â(i−1), â(i−2), â(i−3) are 0, 0, 0, and 1, respectively, then ŷ (the output of filter 802 with channel response ĥ) is −15. The slope s (the output of slope 804) is −1. If the actual ADC output y is −10, then the phase offset τ is s(y−ŷ)=−1(−10−−15)=−5.

The perpendicular, peak sampling lookup tables are $$\begin{bmatrix} \hat{a}[i] & \hat{a}[i-1] & \hat{a}[i-2] & \hat{a}[i-3] & \hat{a}[i-4] & & \hat{y}[i] & s[i] \\ 0 & 0 & 0 & 0 & 0 & : & -10 & 0 \\ 0 & 0 & 0 & 0 & 1 & : & -13 & -1 \\ 0 & 0 & 0 & 1 & 0 & : & -5 & -2 \\ 0 & 0 & 0 & 1 & 1 & : & -8 & -3 \\ 0 & 0 & 1 & 0 & 0 & : & 6 & 0 \\ 0 & 0 & 1 & 0 & 1 & : & 3 & -1 \\ 0 & 0 & 1 & 1 & 0 & : & 11 & -2 \\ 0 & 0 & 1 & 1 & 1 & : & 8 & -3 \\ 0 & 1 & 0 & 0 & 0 & : & -5 & 2 \\ 0 & 1 & 0 & 0 & 1 & : & -8 & 1 \\ 0 & 1 & 0 & 1 & 0 & : & 1 & 0 \\ 0 & 1 & 0 & 1 & 1 & : & -3 & -1 \\ 0 & 1 & 1 & 0 & 0 & : & 11 & 2 \\ 0 & 1 & 1 & 0 & 1 & : & 8 & 1 \\ 0 & 1 & 1 & 1 & 0 & : & 16 & 0 \\ 0 & 1 & 1 & 1 & 1 & : & 13 & -1 \\ 1 & 0 & 0 & 0 & 0 & : & -13 & 1 \\ 1 & 0 & 0 & 0 & 1 & : & -16 & 0 \\ 1 & 0 & 0 & 1 & 0 & : & -8 & -1 \\ 1 & 0 & 0 & 1 & 1 & : & -11 & -2 \\ 1 & 0 & 1 & 0 & 0 & : & 3 & 1 \\ 1 & 0 & 1 & 0 & 1 & : & -1 & 0 \\ 1 & 0 & 1 & 1 & 0 & : & 8 & -1 \\ 1 & 0 & 1 & 1 & 1 & : & 5 & -2 \\ 1 & 1 & 0 & 0 & 0 & : & -8 & 3 \\ 1 & 1 & 0 & 0 & 1 & : & -11 & 2 \\ 1 & 1 & 0 & 1 & 0 & : & -3 & 1 \\ 1 & 1 & 0 & 1 & 1 & : & -6 & 0 \\ 1 & 1 & 1 & 0 & 0 & : & 8 & 3 \\ 1 & 1 & 1 & 0 & 1 & : & 5 & 2 \\ 1 & 1 & 1 & 1 & 0 & : & 13 & 1 \\ 1 & 1 & 1 & 1 & 1 & : & 10 & 0 \end{bmatrix}$$

The perpendicular, side sampling lookup tables are $$\begin{bmatrix} \hat{a}[i] & \hat{a}[i-1] & \hat{a}[i-2] & \hat{a}[i-3] & & \hat{y}[i] & s[i] \\ 0 & 0 & 0 & 0 & : & 0 & 0 \\ 0 & 0 & 0 & 1 & : & -8 & 1 \\ 0 & 0 & 1 & 0 & : & -8 & -1 \\ 0 & 0 & 1 & 1 & : & -16 & 0 \\ 0 & 1 & 0 & 0 & : & 8 & -1 \\ 0 & 1 & 0 & 1 & : & 0 & 0 \\ 0 & 1 & 1 & 0 & : & 0 & -2 \\ 0 & 1 & 1 & 1 & : & -8 & -1 \\ 1 & 0 & 0 & 0 & : & 8 & 1 \\ 1 & 0 & 0 & 1 & : & 0 & 2 \\ 1 & 0 & 1 & 0 & : & 0 & 0 \\ 1 & 0 & 1 & 1 & : & -8 & 1 \\ 1 & 1 & 0 & 0 & : & 16 & 0 \\ 1 & 1 & 0 & 1 & : & 8 & 1 \\ 1 & 1 & 1 & 0 & : & 8 & -1 \\ 1 & 1 & 1 & 1 & : & 0 & 0 \end{bmatrix}$$

Loop filter 418 averages the estimated phase errors provided by the timing gradient. In some embodiments, loop filter 418 includes a first and second order accumulator in series having gains of $K_p$ and $K_f$, respectively. The timing loop bandwidth for various values of $K_p$ and $K_f$ is as follows.

|  |  | \multicolumn{7}{c}{Kf} |
|---|---|---|---|---|---|---|---|---|
|  |  | 1 | 2 | 3 | 4 | 5 | 6 | 7 |
|  | 1 | 0.02 | 0.03 | 0.04 | 0.06 | 0.08 | 0.11 | 0.16 |
|  | 2 | 0.02 | 0.03 | 0.04 | 0.06 | 0.08 | 0.12 | 0.16 |
|  | 3 | 0.03 | 0.04 | 0.05 | 0.06 | 0.08 | 0.12 | 0.16 |
|  | 4 | 0.04 | 0.04 | 0.05 | 0.06 | 0.08 | 0.12 | 0.16 |
|  | 5 | 0.04 | 0.05 | 0.05 | 0.07 | 0.09 | 0.12 | 0.17 |
|  | 6 | 0.05 | 0.05 | 0.06 | 0.07 | 0.09 | 0.12 | 0.17 |
|  | 7 | 0.06 | 0.06 | 0.06 | 0.08 | 0.09 | 0.12 | 0.17 |
|  | 8 | 0.06 | 0.06 | 0.07 | 0.08 | 0.10 | 0.13 | 0.17 |
|  | 9 | 0.07 | 0.07 | 0.08 | 0.09 | 0.10 | 0.13 | 0.17 |
|  | 10 | 0.08 | 0.08 | 0.08 | 0.09 | 0.11 | 0.13 | 0.17 |
|  | 11 | 0.08 | 0.09 | 0.09 | 0.10 | 0.11 | 0.14 | 0.18 |
|  | 12 | 0.09 | 0.09 | 0.10 | 0.10 | 0.12 | 0.14 | 0.18 |
|  | 13 | 0.10 | 0.10 | 0.10 | 0.11 | 0.12 | 0.15 | 0.18 |
| Kp | 14 | 0.11 | 0.11 | 0.11 | 0.12 | 0.13 | 0.15 | 0.19 |
|  | 15 | 0.12 | 0.12 | 0.12 | 0.12 | 0.14 | 0.15 | 0.19 |

-continued

|    |      |      |      |      |      |      |      |
|----|------|------|------|------|------|------|------|
| 16 | 0.12 | 0.12 | 0.13 | 0.13 | 0.14 | 0.16 | 0.20 |
| 17 | 0.13 | 0.13 | 0.13 | 0.14 | 0.15 | 0.17 | 0.20 |
| 18 | 0.14 | 0.14 | 0.14 | 0.15 | 0.15 | 0.17 | 0.20 |
| 19 | 0.15 | 0.15 | 0.15 | 0.15 | 0.16 | 0.18 | 0.21 |
| 20 | 0.15 | 0.15 | 0.16 | 0.16 | 0.17 | 0.18 | 0.21 |
| 21 | 0.16 | 0.16 | 0.16 | 0.17 | 0.17 | 0.19 | 0.22 |
| 22 | 0.17 | 0.17 | 0.17 | 0.17 | 0.18 | 0.20 | 0.22 |
| 23 | 0.18 | 0.18 | 0.18 | 0.18 | 0.19 | 0.20 | 0.23 |
| 24 | 0.19 | 0.19 | 0.19 | 0.19 | 0.20 | 0.21 | 0.24 |
| 25 | 0.19 | 0.19 | 0.19 | 0.20 | 0.20 | 0.22 | 0.24 |
| 26 | 0.20 | 0.20 | 0.20 | 0.21 | 0.21 | 0.22 | 0.25 |
| 27 | 0.21 | 0.21 | 0.21 | 0.21 | 0.22 | 0.23 | 0.25 |
| 28 | 0.22 | 0.22 | 0.22 | 0.22 | 0.23 | 0.24 | 0.26 |
| 29 | 0.22 | 0.23 | 0.23 | 0.23 | 0.23 | 0.24 | 0.26 |
| 30 | 0.23 | 0.23 | 0.23 | 0.24 | 0.24 | 0.25 | 0.27 |
| 31 | 0.24 | 0.24 | 0.24 | 0.24 | 0.25 | 0.26 | 0.28 |

The timing loop damping factor for various values of $K_p$ and $K_f$ is as follows.

$$\zeta = \frac{K_p}{2\sqrt{K_f}}$$

| Kp \ Kf | 1 | 2 | 3 | 4 | 5 | 6 | 7 |
|----|------|------|------|------|------|------|------|
| 1  | 0.19 | 0.13 | 0.09 | 0.07 | 0.05 | 0.03 | 0.02 |
| 2  | 0.38 | 0.27 | 0.19 | 0.13 | 0.09 | 0.07 | 0.05 |
| 3  | 0.56 | 0.40 | 0.28 | 0.20 | 0.14 | 0.10 | 0.07 |
| 4  | 0.75 | 0.53 | 0.38 | 0.27 | 0.19 | 0.13 | 0.09 |
| 5  | 0.94 | 0.66 | 0.47 | 0.33 | 0.23 | 0.17 | 0.12 |
| 6  | 1.12 | 0.80 | 0.56 | 0.40 | 0.28 | 0.20 | 0.14 |
| 7  | 1.31 | 0.93 | 0.66 | 0.46 | 0.33 | 0.23 | 0.16 |
| 8  | 1.50 | 1.06 | 0.75 | 0.53 | 0.38 | 0.27 | 0.19 |
| 9  | 1.69 | 1.19 | 0.84 | 0.60 | 0.42 | 0.30 | 0.21 |
| 10 | 1.88 | 1.33 | 0.94 | 0.66 | 0.47 | 0.33 | 0.23 |
| 11 | 2.06 | 1.46 | 1.03 | 0.73 | 0.52 | 0.36 | 0.26 |
| 12 | 2.25 | 1.59 | 1.12 | 0.80 | 0.56 | 0.40 | 0.28 |
| 13 | 2.44 | 1.72 | 1.22 | 0.86 | 0.61 | 0.43 | 0.30 |
| 14 | 2.62 | 1.86 | 1.31 | 0.93 | 0.66 | 0.46 | 0.33 |
| 15 | 2.81 | 1.99 | 1.41 | 0.99 | 0.70 | 0.50 | 0.35 |
| 16 | 3.00 | 2.12 | 1.50 | 1.06 | 0.75 | 0.53 | 0.38 |
| 17 | 3.19 | 2.25 | 1.59 | 1.13 | 0.80 | 0.56 | 0.40 |
| 18 | 3.38 | 2.39 | 1.69 | 1.19 | 0.84 | 0.60 | 0.42 |
| 19 | 3.56 | 2.52 | 1.78 | 1.26 | 0.89 | 0.63 | 0.45 |
| 20 | 3.75 | 2.65 | 1.88 | 1.33 | 0.94 | 0.66 | 0.47 |
| 21 | 3.94 | 2.78 | 1.97 | 1.39 | 0.98 | 0.70 | 0.49 |
| 22 | 4.12 | 2.92 | 2.06 | 1.46 | 1.03 | 0.73 | 0.52 |
| 23 | 4.31 | 3.05 | 2.16 | 1.52 | 1.08 | 0.76 | 0.54 |
| 24 | 4.50 | 3.18 | 2.25 | 1.59 | 1.12 | 0.80 | 0.56 |
| 25 | 4.69 | 3.31 | 2.34 | 1.66 | 1.17 | 0.83 | 0.59 |
| 26 | 4.88 | 3.45 | 2.44 | 1.72 | 1.22 | 0.86 | 0.61 |
| 27 | 5.06 | 3.58 | 2.53 | 1.79 | 1.27 | 0.89 | 0.63 |
| 28 | 5.25 | 3.71 | 2.62 | 1.86 | 1.31 | 0.93 | 0.66 |
| 29 | 5.44 | 3.84 | 2.72 | 1.92 | 1.36 | 0.96 | 0.68 |
| 30 | 5.62 | 3.98 | 2.81 | 1.99 | 1.41 | 0.99 | 0.70 |
| 31 | 5.81 | 4.11 | 2.91 | 2.06 | 1.45 | 1.03 | 0.73 |

FIG. 9 is a plot illustrating an example of the DFE and Viterbi detector sensitivity to incorrect sampling phase. The Viterbi performance is shown using decisions tapped off after a traceback of 4T and 6T. It can be seen that under these operating conditions the Viterbi with a path memory truncation of 6 can sustain +−25% T mis-sampling while maintaining <1e−2 BER, which should be sufficient to keep the timing loop locked.

Figure 10B:
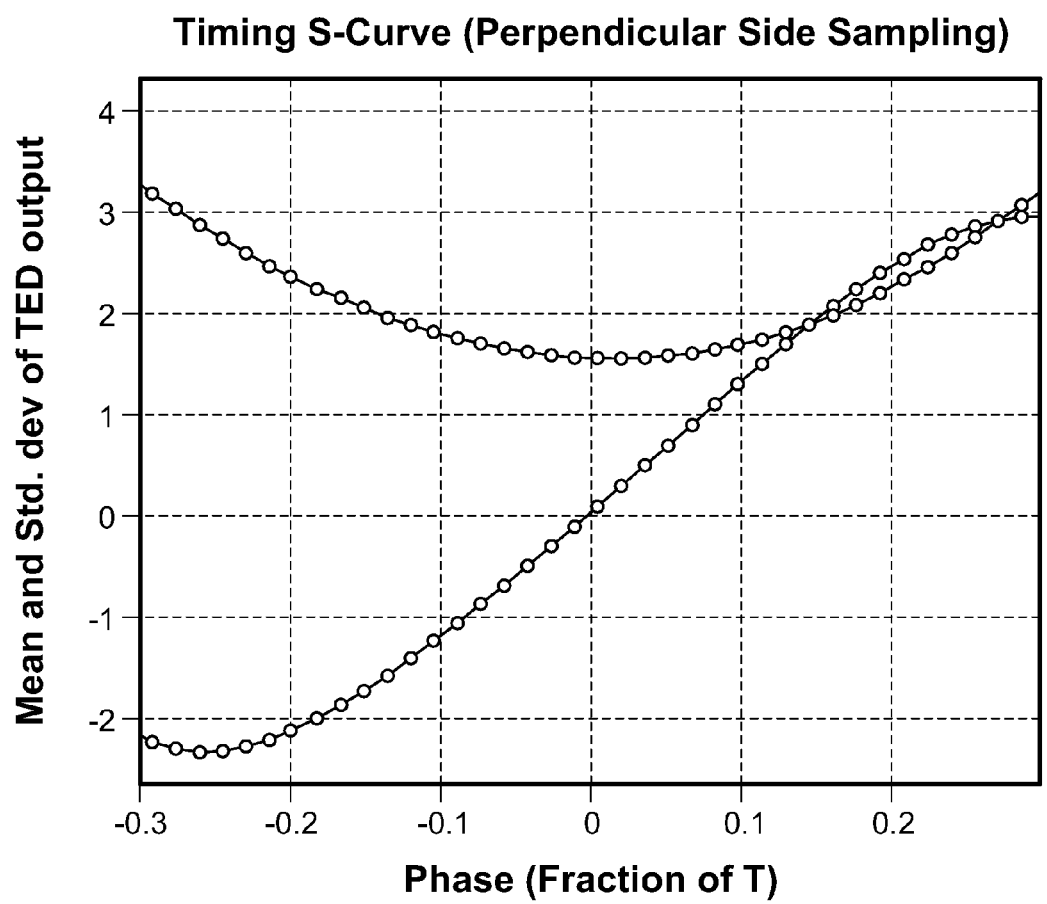
Figure 10C:
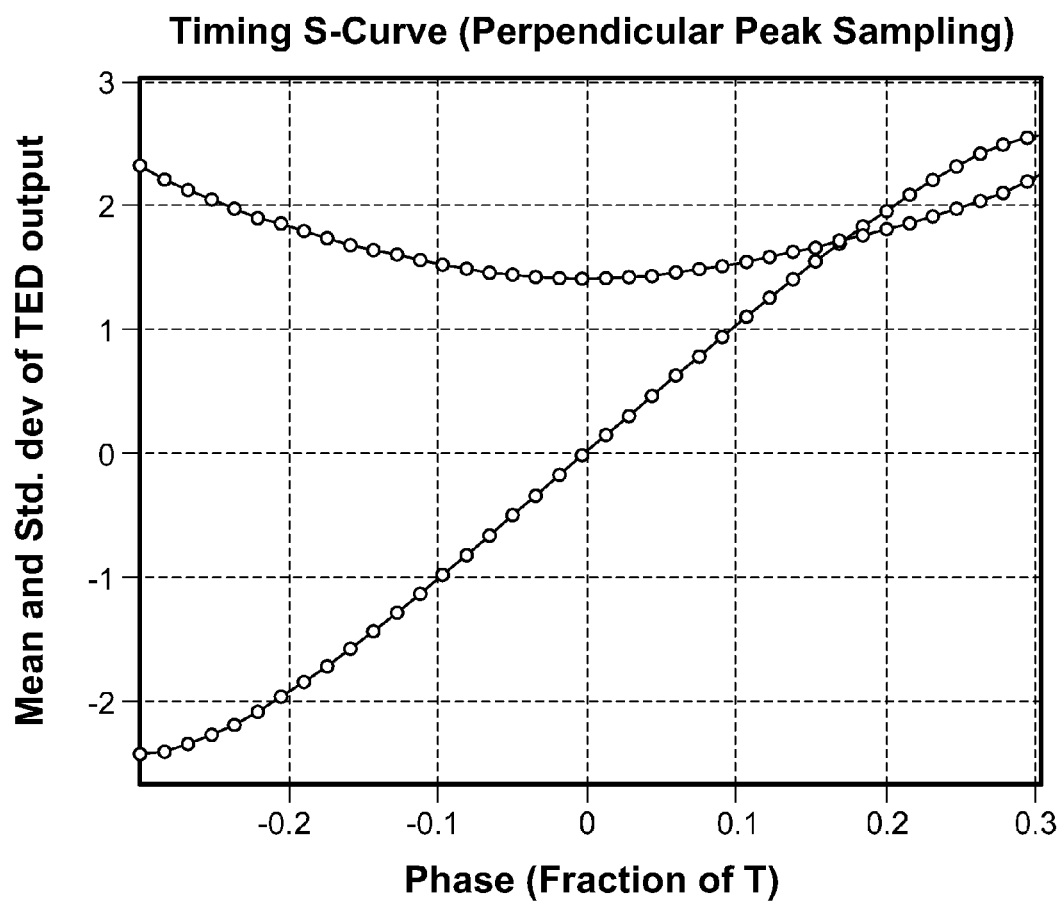

FIGS. 10A-10C are s-curves illustrating examples of the mean and variance of the timing error detector for each of the three modes of operation. The s-curves were computed using DFE decisions. For example, FIG. 10A is obtained by holding the timing loop open and inputting signals with various phase offsets (shown as a fraction of a period T). As shown, the mean timing error detector output (the lower curve) is substantially linear with the phase offset. However, the standard deviation (the upper curve) increases for larger phase offset.

Figure 10D:
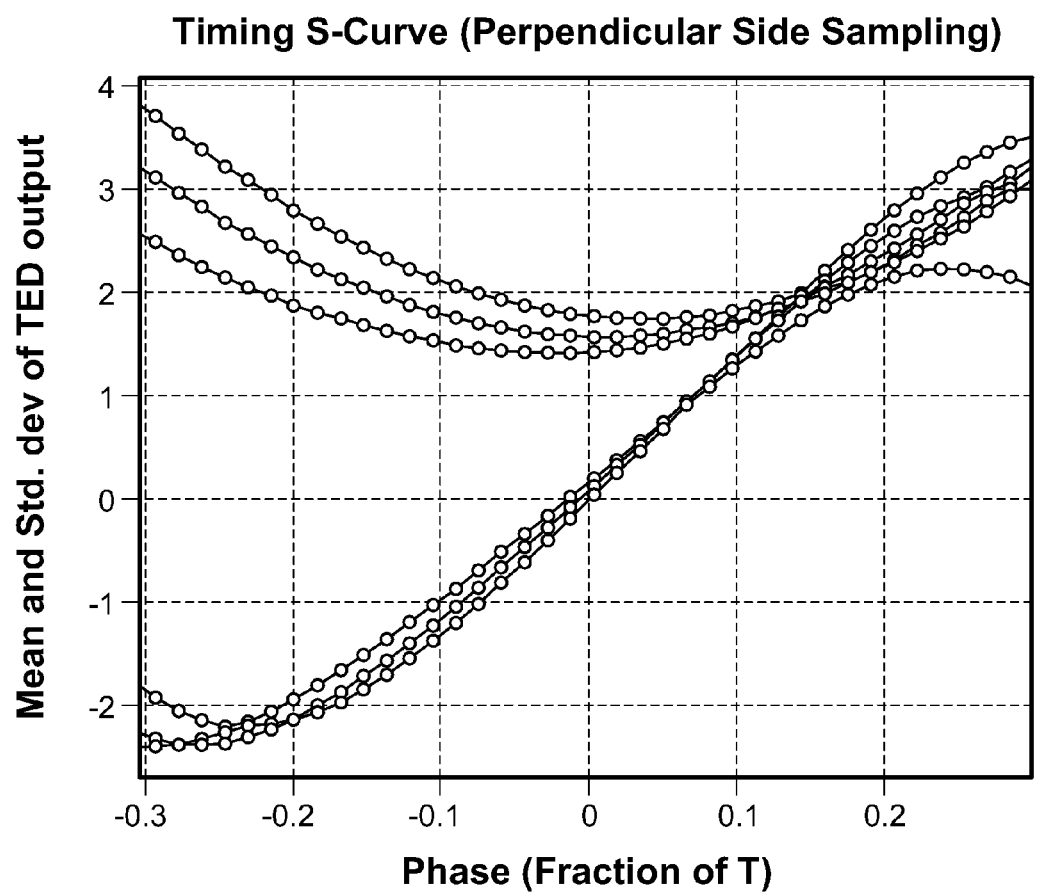
FIG. 10D illustrates an example of the timing function's sensitivity to gain error for the second mode.

FIG. 10D illustrates an example of the timing function's sensitivity to gain error for the second mode. As shown, the timing function's sensitivity to gain error is small.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of adapting a read channel processor, including:
   determining a target output from a variable target function when a known sequence is provided as input to the variable target function;
   determining a filter output from a programmable filter having programmable filter coefficients when a received sequence is provided as input to the programmable target function;
   comparing the target output and the filter output, wherein comparing is performed by a processor; and
   recursively updating both the variable target function and the programmable filter coefficients to improve the comparison between the target output and the filter output.

2. A method as recited in claim 1, wherein the programmable filter is an FIR filter.

3. A method as recited in claim 1, wherein recursively updating includes updating at least one programmable filter coefficient.

4. A method as recited in claim 1, wherein recursively updating includes updating at least one target function coefficient.

5. A method as recited in claim 1, wherein recursively updating includes determining whether an error criterion is reached.

6. A method as recited in claim 1, wherein an improved comparison includes a lower mean squared error between the target output and the filter output.

7. A method as recited in claim 1, wherein recursively updating includes determining whether a certain mean squared error has been reached.

8. A method as recited in claim 1, wherein recursively updating includes using a recursive optimization method.

9. A method as recited in claim 1, wherein recursively updating includes using a least mean squares (LMS) method.

10. A method as recited in claim 1, wherein updating is performed during manufacture.

11. A method as recited in claim 1, wherein updating is performed online.

12. A method as recited in claim 1, further including automatically determining whether updating needs to be performed.

13. A method as recited in claim 1, further including adaptively generating a sampling clock without a contribution from the programmable filter.

14. A method as recited in claim 1, further including determining a sampling phase such that the sampling occurs substantially on a side of an expected signal waveform corresponding to the input data.

15. A method as recited in claim 1, wherein the processor is selectably coupled to a plurality of channel models.

16. A system for adapting a read channel processor, including:
   a processor configured to:

determine a target output from a variable target function when a known sequence is provided as input to the variable target function;

determine a filter output from a programmable filter having programmable filter coefficients when a received sequence is provided as input to the programmable target function;

compare the target output and the filter output; and recursively update both the variable target function and the programmable filter coefficients to improve the comparison between the target output and the filter output; and a memory coupled with the processor, wherein the memory provides the processor with instructions.

17. A system as recited in claim 16, wherein the processor is configured to recursively update at least in part by updating at least one programmable filter coefficient.

18. A system as recited in claim 16, wherein the processor is configured to recursively update at least in part by updating at least one target function coefficient.

19. A system as recited in claim 16, wherein the processor is configured to recursively update at least in part by using a recursive optimization method.

20. A computer program product for adapting a read channel processor, the computer program product being embodied in a computer readable storage medium and comprising computer instructions for:

determining a target output from a variable target function when a known sequence is provided as input to the variable target function;

determining a filter output from a programmable filter having programmable filter coefficients when a received sequence is provided as input to the programmable target function;

comparing the target output and the filter output; and recursively updating both the variable target function and the programmable filter coefficients to improve the comparison between the target output and the filter output.

21. A computer program product as recited in claim 20, wherein recursively updating includes updating at least one programmable filter coefficient.

22. A computer program product as recited in claim 20, wherein recursively updating includes updating at least one target function coefficient.

23. A computer program product as recited in claim 20, wherein recursively updating includes using a recursive optimization method.

* * * * *